(12) United States Patent  (10) Patent No.: US 8,797,001 B2
Elmqvist et al.  (45) Date of Patent: Aug. 5, 2014

(54) CAPACITOR CHARGER SYSTEM AND DIGITAL CONTROL MODULE AND ISOLATED ACQUISITION MODULE FOR SUCH A CAPACITOR CHARGER SYSTEM

(75) Inventors: Klas Elmqvist, Uppsala (SE); Carl Hartman, Uppsala (SE); Magnus Graas, Uppsala (SE); Andreas Wickström, Stockholm (SE); Jonas Gustafsson, Harbo (SE); Jan Lundgren, Uppsala (SE); Walter Frederick John Crewson, Munsonville, NH (US)

(73) Assignee: Scandinova Systems AB, Uppsala (SE)

( * ) Notice: Subject to any disclaimer, the term of this patent is extended or adjusted under 35 U.S.C. 154(b) by 363 days.

(21) Appl. No.: 13/378,795

(22) PCT Filed: Jun. 30, 2009

(86) PCT No.: PCT/SE2009/050834
§ 371 (c)(1),
(2), (4) Date: Dec. 16, 2011

(87) PCT Pub. No.: WO2011/002358
PCT Pub. Date: Jan. 6, 2011

(65) Prior Publication Data
US 2012/0086410 A1    Apr. 12, 2012

(51) Int. Cl.
*H02J 7/00* (2006.01)

(52) U.S. Cl.
USPC .......................................... 320/166; 307/109

(58) Field of Classification Search
USPC ................ 320/166, 106; 307/109; 363/59, 74
See application file for complete search history.

(56) References Cited

U.S. PATENT DOCUMENTS 5,568,035 A * 10/1996 Kato et al. .................... 320/166
5,773,963 A    6/1998 Blanc et al.

(Continued)

FOREIGN PATENT DOCUMENTS

JP      2007-325375        12/2007
WO      WO 01/97377        12/2001
WO      WO 2005/011095      3/2005

OTHER PUBLICATIONS

International Search Report for PCT/SE2009/050834, mailed Mar. 15, 2010.

(Continued)

*Primary Examiner* — Yalkew Fantu
(74) *Attorney, Agent, or Firm* — Nixon & Vanderhye P.C.

(57) ABSTRACT

The invention relates to a capacitor charger system (100) comprising a capacitor charger module (110), an isolated acquisition module (120), and a digital control module (130). The isolated acquisition module (120) is configured for sampling an output voltage level of said capacitor charger module (110). The digital control module (130) is connected to the isolated acquisition module (120) via a bi-directional link and connected to the capacitor charger module (110) via a control signal interface. The digital control module (130) is configured for generating control signal information and synchronization signal information based on data representative of sampled output voltage levels received via the bi-directional link from the isolated acquisition module. The digital control module (130) is further configured for sending the control signal information to the capacitor charger module (110) via the control signal interface and for sending the synchronization signal information to the isolated acquisition module (120) via the bidirectional link. The capacitor charger module (110) is controlled based on the control signal information from the digital control module, and the isolated acquisition module (120) is configured for performing sampling based on the synchronization signal information.

19 Claims, 7 Drawing Sheets

(56) References Cited

U.S. PATENT DOCUMENTS

| | | | |
|---|---|---|---|
| 6,661,205 B1 | 12/2003 | Muraki et al. | |
| 7,750,607 B2 * | 7/2010 | Nakajima et al. | 320/167 |
| 2004/0257833 A1 | 12/2004 | Yang et al. | |
| 2004/0257839 A1 | 12/2004 | Yang et al. | |
| 2008/0079399 A1 * | 4/2008 | Schiller | 320/166 |
| 2008/0084184 A1 * | 4/2008 | Ohnuki | 320/116 |
| 2008/0169791 A1 * | 7/2008 | Daio | 320/166 |
| 2008/0290841 A1 * | 11/2008 | Chang et al. | 320/166 |

OTHER PUBLICATIONS

European Communication dated May 12, 2014 in European Application No. 09 84 6904 with a Supplementary European Search Report.

* cited by examiner

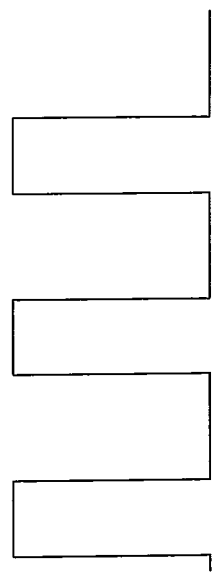
FIG. 4A  PWM PATTERN
FIG. 4B  VOLTAGE BETWEEN OUTPUT LINES
FIG. 4C  SAMPLE CONTROL PULSE OF ADC
FIG. 4D  VOLTAGE BETWEEN ZERO VOLT LINE AND GROUND

US 8,797,001 B2

CAPACITOR CHARGER SYSTEM AND DIGITAL CONTROL MODULE AND ISOLATED ACQUISITION MODULE FOR SUCH A CAPACITOR CHARGER SYSTEM

This application is the U.S. national phase of International Application No. PCT/SE2009/050834, filed 30 Jun. 2009, which designated the U.S., the entire contents of which is hereby incorporated by reference.

TECHNICAL FIELD

The present invention generally relates to capacitor charger systems, and more particularly to a capacitor charger system having high stability and/or precision, and a digital control module and isolated acquisition module for such a capacitor charger system.

BACKGROUND

The uses of capacitor charger systems are common wherever short, high current pulses are utilized. Examples of applications include power modulators, accelerators, light flashes, z-ray systems and so forth. When the capacitors are discharged partly or completely the high current is achieved. The stability of the current is directly dependent on the voltage that is fed by the capacitor charger system. A stable capacitor charger voltage will hence give a stable current from the pulsing system. Since it is normal to have high current spikes and sensitive electronics in the same system the regulation of the charging speed and end-voltage level is not easy to get precise. The stability of the complete regulation system is very much dependent on the precision of the measurement of the output voltage of the capacitor charger system. Normally the output voltage is measured via a resistive voltage divider and the origin of distortions is normally the high currents that are switched on and off in the capacitor charger module. These switch events are generating voltage distortions both relative the common ground and as real voltage variations at the output dependent on the cable inductance to the charged capacitor.

SUMMARY

The present invention overcomes these and other drawbacks of the prior art arrangements.

It is a general object to provide an improved capacitor charger system.

It is a specific object to provide a power modulator based on a capacitor charger system.

It is also an object to provide a digital control module for a capacitor charger system.

It is also an object to provide an isolated acquisition module for a capacitor charger system.

These and other objects are met as defined by the accompanying patent claims.

In a first aspect, the invention relates to a capacitor charger system comprising a capacitor charger module, an isolated acquisition module, and a digital control module. The isolated acquisition module is configured for sampling an output voltage level of said capacitor charger module. The digital control module is connected to the isolated acquisition module via a bi-directional link and connected to the capacitor charger module via a control signal interface. The digital control module is configured for generating control signal information and synchronization signal information based on data representative of sampled output voltage levels received via the bi-directional link from the isolated acquisition module. The digital control module is further configured for sending the control signal information to the capacitor charger module via the control signal interface and for sending the synchronization signal information to the isolated acquisition module via the bi-directional link. The capacitor charger module is controlled based on the control signal information from the digital control module, and the isolated acquisition module is configured for performing sampling based on the synchronization signal information.

Preferably, the isolated acquisition module is configured for performing sampling based on the synchronization signal information at a controlled timing relation to the output pulses of the capacitor charger module.

For example, it may be desirable to implement the capacitor charger module as a Pulse Width Modulated (PWM) capacitor charger module, where the digital control module is configured for generating control signal information in the form of a PWM control pattern including PWM control pulses. Preferably, in this exemplary case, the isolated acquisition module is configured for performing sampling of the output voltage level of the capacitor charger module in close relation before a next PWM control pulse so that distortions in the output voltage of the capacitor charger module from a previous output pulse have faded down to an acceptable level.

By way of example, the output pulse frequency of the capacitor charger module is higher than 10 KHz, and preferably in the order of 25 KHz, and the sampling frequency is preferably at least as high as the output pulse frequency.

With a sampling frequency in this order of magnitude the amount of information to be transferred over the bi-directional link may be quite considerable, and therefore it may be beneficial to implement the bi-directional link as a digital optical link. For this purpose, the isolated acquisition module and the digital control module may each have an optical input/output interface.

In a second aspect there is provided a digital control module for a capacitor charger system. The capacitor charger system has a capacitor charger module and an isolated acquisition module for sampling an output voltage level of said capacitor charger module. The digital control module is connected to the isolated acquisition module via a bi-directional link and connected to the capacitor charger module via a control signal interface. The digital control module is configured for generating control signal information and synchronization signal information based on data representative of sampled output voltage levels of the capacitor charger module received via the bi-directional link from the isolated acquisition module. The digital control module is further configured for sending the control signal information to the capacitor charger module via the control signal interface to control the output pulses of the capacitor charger module, and for sending the synchronization signal information to the isolated acquisition module via the bi-directional link to control the sampling operation of the isolated acquisition module.

In a third aspect there is provided an isolated acquisition module for a capacitor charger system. The capacitor charger system has a capacitor charger module and a digital control module. The isolated acquisition module is connected to the digital control module via a bi-directional link, and the isolated acquisition module is configured for sampling an output voltage level of the capacitor charger module at a controlled timing relation to the output pulses of the capacitor charger module based on synchronization signal information from the digital control module.

The different aspects of the invention include a capacitor charger system, a power modulator including a capacitor charger system, and a digital control module and an isolated acquisition module for a capacitor charger system.

Other advantages offered by the invention will be appreciated when reading the below description of embodiments of the invention.

BRIEF DESCRIPTION OF THE DRAWINGS

The invention, together with further objects and advantages thereof, will be best understood by reference to the following description taken together with the accompanying drawings, in which:

FIGS. 4A-D are schematic signal diagrams according to a particular example.

DETAILED DESCRIPTION OF EMBODIMENTS

Figure 1:
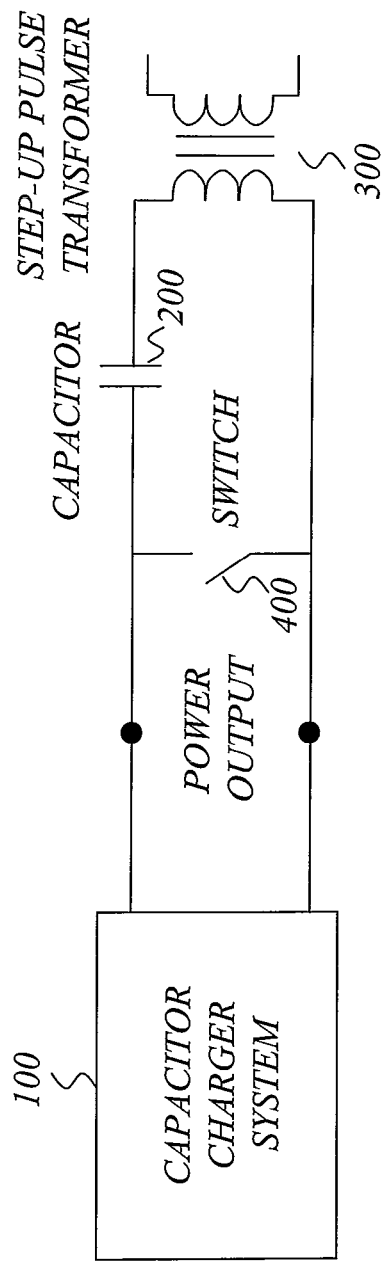
FIG. 1 is a schematic diagram illustrating an illustrative application involving a capacitor charger system.

Throughout the drawings, the same reference characters will be used for corresponding or similar elements.

FIG. 1 is a schematic diagram illustrating an illustrative application involving a capacitor charger system. The overall application illustrated in FIG. 1 basically corresponds to a power modulator, and shows the complete capacitor charger system 100 and how it is connected to a capacitor 200 and further on to an optional step-up pulse transformer 300. The output of the capacitor 200 is going through the primary winding of the step-up transformer 300. The switch 400 that is discharging the capacitor 200 is basically short-circuiting the capacitor charging system output.

Figure 2:
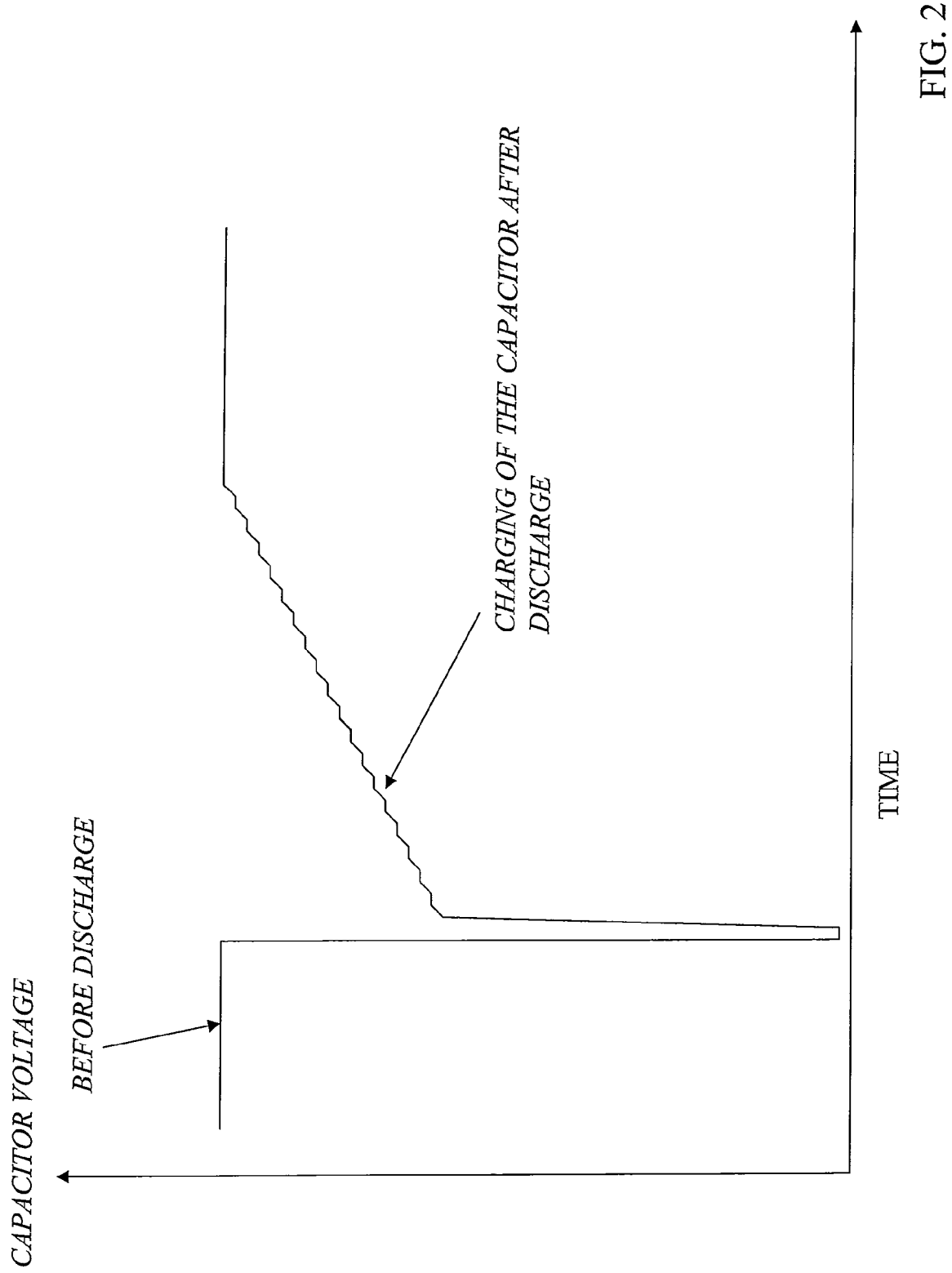
FIG. 2 illustrates an example of the capacitor voltage over time.

FIG. 2 illustrates an example of the capacitor voltage over time. The capacitor discharges in a pulse-like manner and is then charged again, first rapidly and then usually more slowly until the capacitor is fully charged and ready to be discharged again.

By way of example, the output pulses of the capacitor charger module have a voltage higher than 500 V but lower than 2500 V, and preferably between 900 and 1500 V.

Examples of suitable switches for use in a power modulator as that illustrated in FIG. 1 includes IGBT (Insulated Gate Bipolar Transistor) switches and similar switches that are electronically controllable at on-off.

Of course, other applications exist as already mentioned in the background section.

Figure 3:
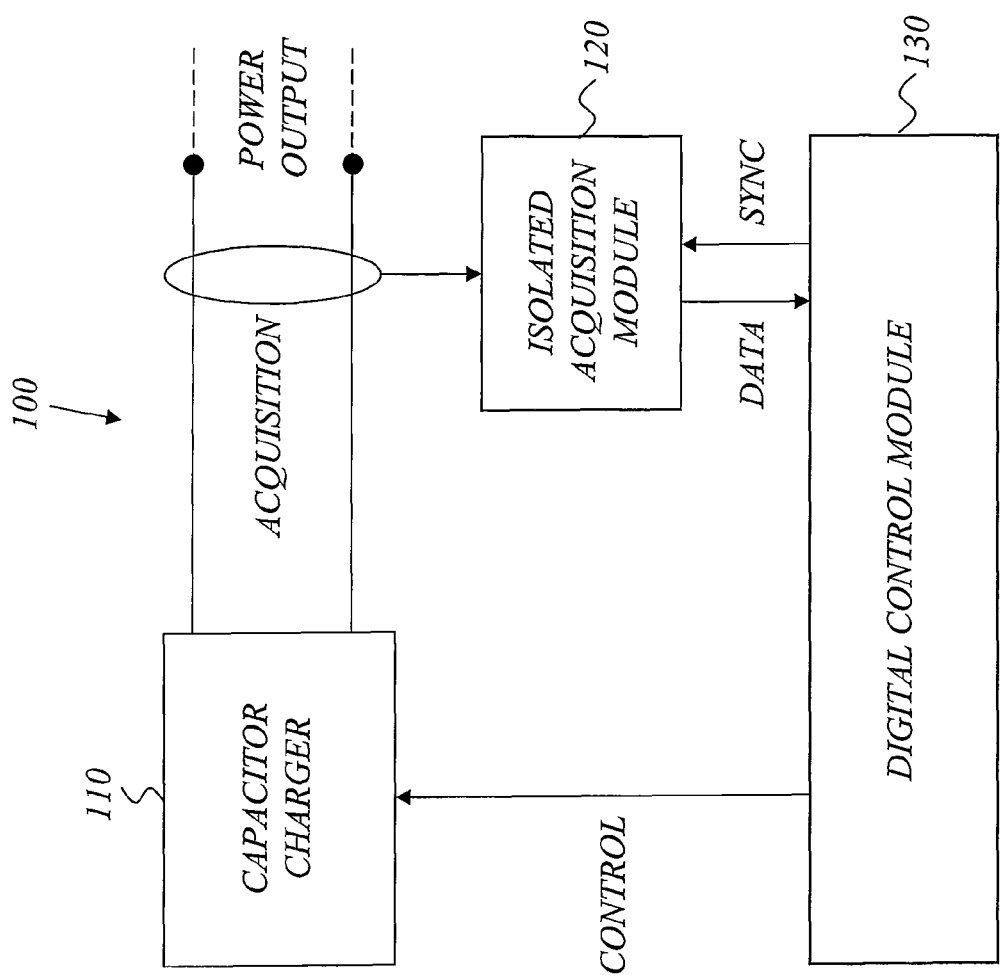
FIG. 3 is a schematic diagram illustrating a capacitor charger system according to an exemplary embodiment.

FIG. 3 is a schematic diagram illustrating a capacitor charger system according to an exemplary embodiment. The capacitor charger system 100 basically comprises a capacitor charger module 110, an isolated acquisition module 120, and a digital control module 130. The isolated acquisition module 120 is configured for sampling an output voltage level of the capacitor charger module 110. The digital control module 130 is connected to the isolated acquisition module 120 via a bi-directional link and connected to the capacitor charger module 110 via a control signal interface. The digital control module 130 is configured for generating control signal information and synchronization signal information based on data representative of sampled output voltage levels received via the bi-directional link from the isolated acquisition module 120. The digital control module 130 is further configured for sending the control signal information to the capacitor charger module 110 via the control signal interface and for sending the synchronization signal information to the isolated acquisition module 120 via the bi-directional link. The capacitor charger module 110 is controlled based on the control signal information from the digital control module, and the isolated acquisition module 120 is configured for performing sampling based on the synchronization signal information.

In particular, it is desirable to isolate the measurement from the common ground and give the possibility to measure or sample the output voltage when the switching distortions are low or zero.

Preferably, the isolated acquisition module 120 is configured for performing sampling based on the synchronization signal information at a controlled timing relation to the output pulses of the capacitor charger module 110 to ensure sampling when output voltage distortions are reasonably low.

For example, it may be desirable to implement the capacitor charger module as a Pulse Width Modulated (PWM) capacitor charger module, where the digital control module is configured for generating control signal information in the form of a PWM control pattern including PWM control pulses. Preferably, in this exemplary case, the isolated acquisition module is configured for performing sampling of the output voltage level of the capacitor charger module in close relation before a next PWM control pulse so that distortions in the output voltage of the capacitor charger module from a previous output pulse have faded down to an acceptable level. It is thus desirable to sample the output voltage when the PWM pulse pattern is "silent" and when switching distortions and other distortions have generally faded out below a given threshold.

Reference can for example be made to the exemplary signal diagrams of FIGS. 4A-D. FIG. 4A illustrates an example of a PWM control pulse pattern. FIG. 4B illustrates the output voltage pulses between the output lines of the capacitor charger module. FIG. 4C illustrates an example of sample control pulses of an ADC of the isolated acquisition module. It can be seen that the sample control pulses are in a controlled timing relation to the output voltage pulses of the capacitor charger module, and thus also in a similar relation to the PWM pulses, to ensure sampling when output voltage distortions are reasonably low or zero. This ensures a high precision and/or stability in the PWM regulation since the measurements used as a basis for the regulation are more accurately representing the output voltage of the capacitor charger module. FIG. 4D illustrates a representation of the voltage between zero volt line and ground. The scales are illustrative.

Figure 5:
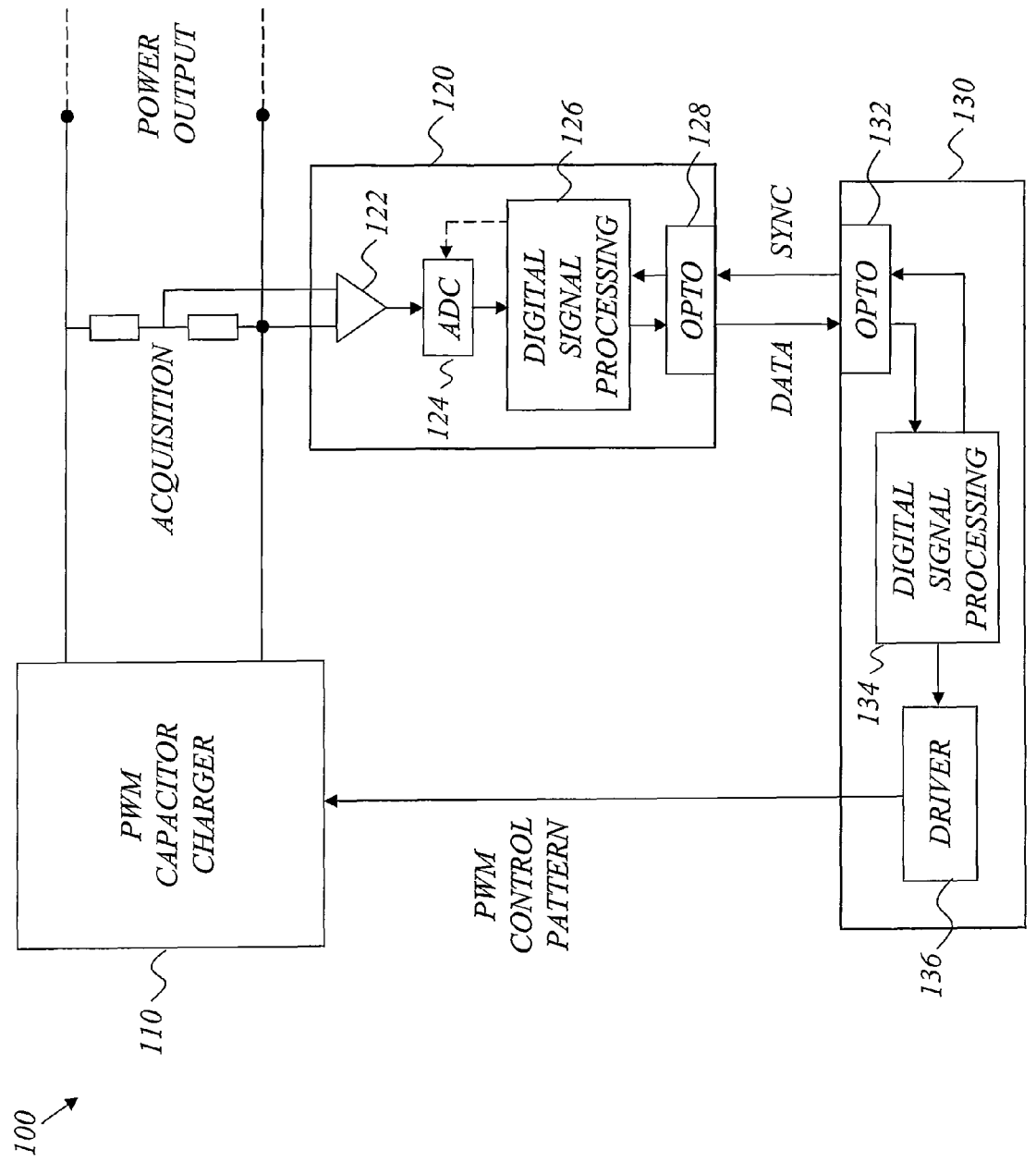
FIG. 5 is a schematic diagram illustrating a particular example of a capacitor charger system according to an exemplary embodiment.

FIG. 5 is a schematic diagram illustrating a particular example of a capacitor charger system according to an exemplary embodiment. In this particular example, the capacitor charger module 110 is implemented as a PWM capacitor charger. The acquisition of the output voltage is for example done via a resistive voltage divider. The voltage from the voltage divider is sensed or acquired by the acquisition module 120. The acquisition module 120 here comprises a (differential) amplifier 122, an Analog-to-Digital Converter (ADC) 124, a digital signal processing module 126 and an optical input/output interface 128. The sensed voltage form the voltage divider is passing the (differential) amplifier 122 and then going to the ADC 124. The output from the ADC 124 connected to the digital signal processing module 126 where the sampled measurement data may be adapted to the serial protocol used in an optical link. The optical link, which is bi-directional, is passing the data to the digital control module 130. The digital control module 130 includes an optical input/output interface 132, a digital signal processing module 134 and a driver 136. The data from the acquisition module 120 is received by the optical input/output interface 132 and then transferred to the digital signal processing module 134. In this example, the module 134 is generating a PWM pattern of PWM control pulses. Preferably, the PWM pattern is amplified in a driver stage 136 before it is sent to the PWM capacitor charger module 110.

By way of example, the output pulse frequency of the capacitor charger module is higher than 10 KHz, and preferably in the order of 25 KHz, and the sampling frequency is preferably at least as high as the output pulse frequency.

With a sampling frequency in this order of magnitude the amount of information to be transferred over the bi-directional link may be quite considerable, and therefore it may be beneficial to implement the bi-directional link as a digital optical link. For this purpose, the isolated acquisition module 120 and the digital control module 130 may each have an optical input/output interface, as illustrated in the example of FIG. 5.

For example, to enable the possibility of using averaging techniques in the digital signal processing of the digital control module 130, the sampling frequency of the ADC 124 of the isolated acquisition module 120 is preferably higher than the output pulse frequency. By way of example, the sampling frequency may be higher than 50 KHz, and preferably in the order of 1 MHz or higher. This means that the data rate may be quite high, for example in the order of between 10 and 500 Mbit/s. For example, if 16 bits are used to represent the output voltage level per sample or measurement, and the sampling frequency is 1 MHz (i.e. 1 Msample/s) this would correspond to a data rate of 16 Mbit/s.

In a particular example, the PWM pattern is generated in the digital control module 130, and synchronized with this, a pulse is sent via an optical link to the Analog-to-Digital Converter (ADC) 124 of the acquisition module 120. This gives the possibility to sample the output voltage at a controlled "delay" related to the PWM pattern. Since the distortions in the output voltage normally tend to fade away or droop with time, a suitable time period for sampling could, because of this, be in close relation before the next PWM pulse. The result of the sample is converted to a serial protocol in the digital signal processing unit 126 on the isolated acquisition board and then sent via an optical link back to the digital control module 130. This module preferably compares the measured values with a reference and change the PWM pattern with respect to the result of this comparison, as illustrated in more detail in the example of FIG. 6.

Figure 6:
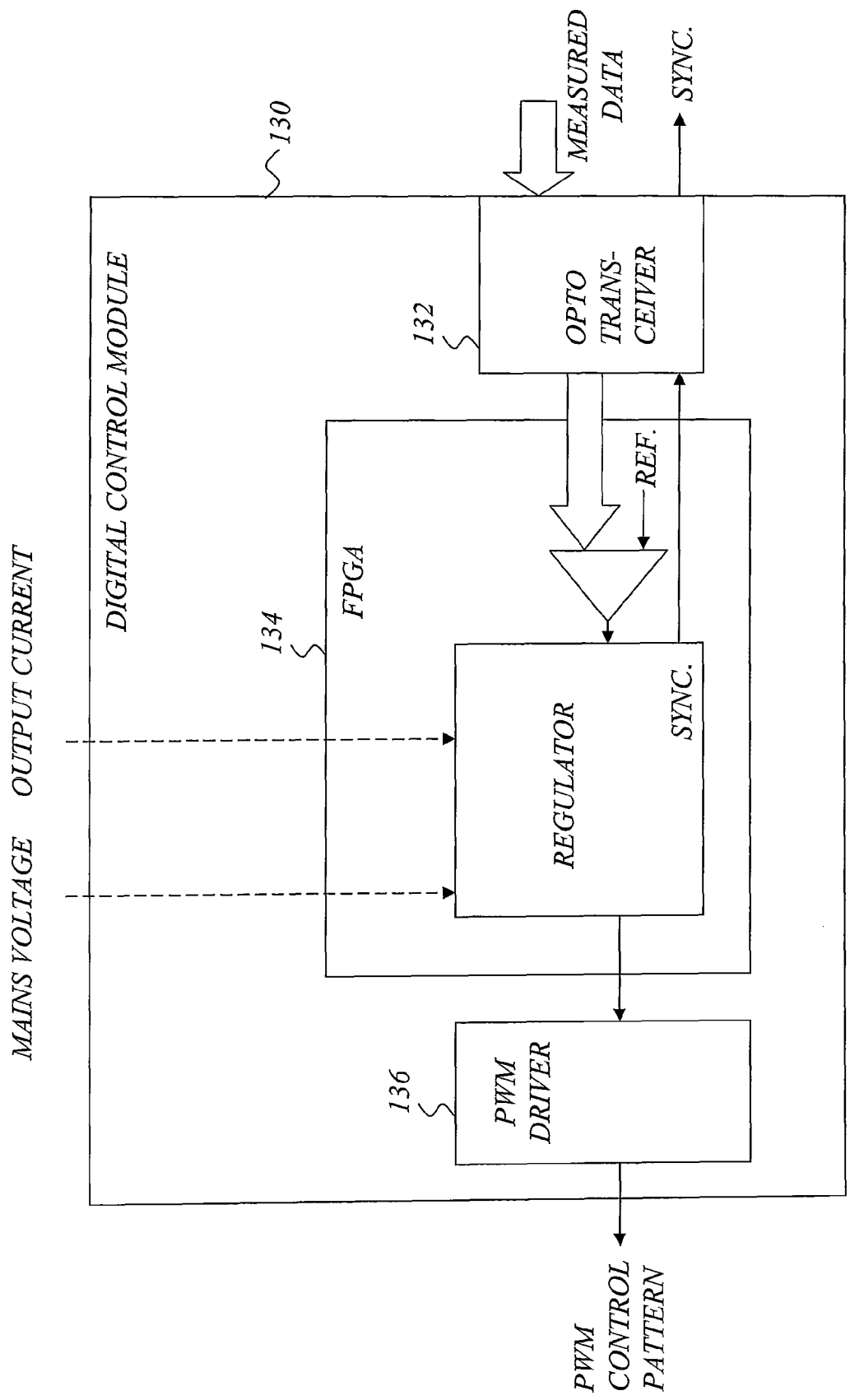
FIG. 6 is a schematic diagram illustrating a particular example of a digital control module for a capacitor charger system.

FIG. 6 is a schematic diagram illustrating a particular example of a digital control module for a capacitor charger system. In this example, the measured/sampled data is received via the opto transceiver 132, i.e. the optical input/output interface, and then transferred to the digital signal processing module 134. For example, the digital signal processing module 134 may be implemented in a Field Programmable Gate Array (FPGA), or alternatively in an Application Specific Integrated Circuit (ASIC) or a Digital Signal Processor (DSP). The digital signal processing module 134 includes a regulator configured to compare measured/sampled data with a predefined reference and change the PWM pattern with respect to the result of this comparison. The regulator may also use optional inputs such as the mains voltage input to the capacitor charger module after rectification and/or the output current of the capacitor charger module for the purpose of improving the PWM regulation. The regulator is also generating a synchronizing signal that is sent to the isolated acquisition module 120 via the opto transceiver 132.

Figure 7:
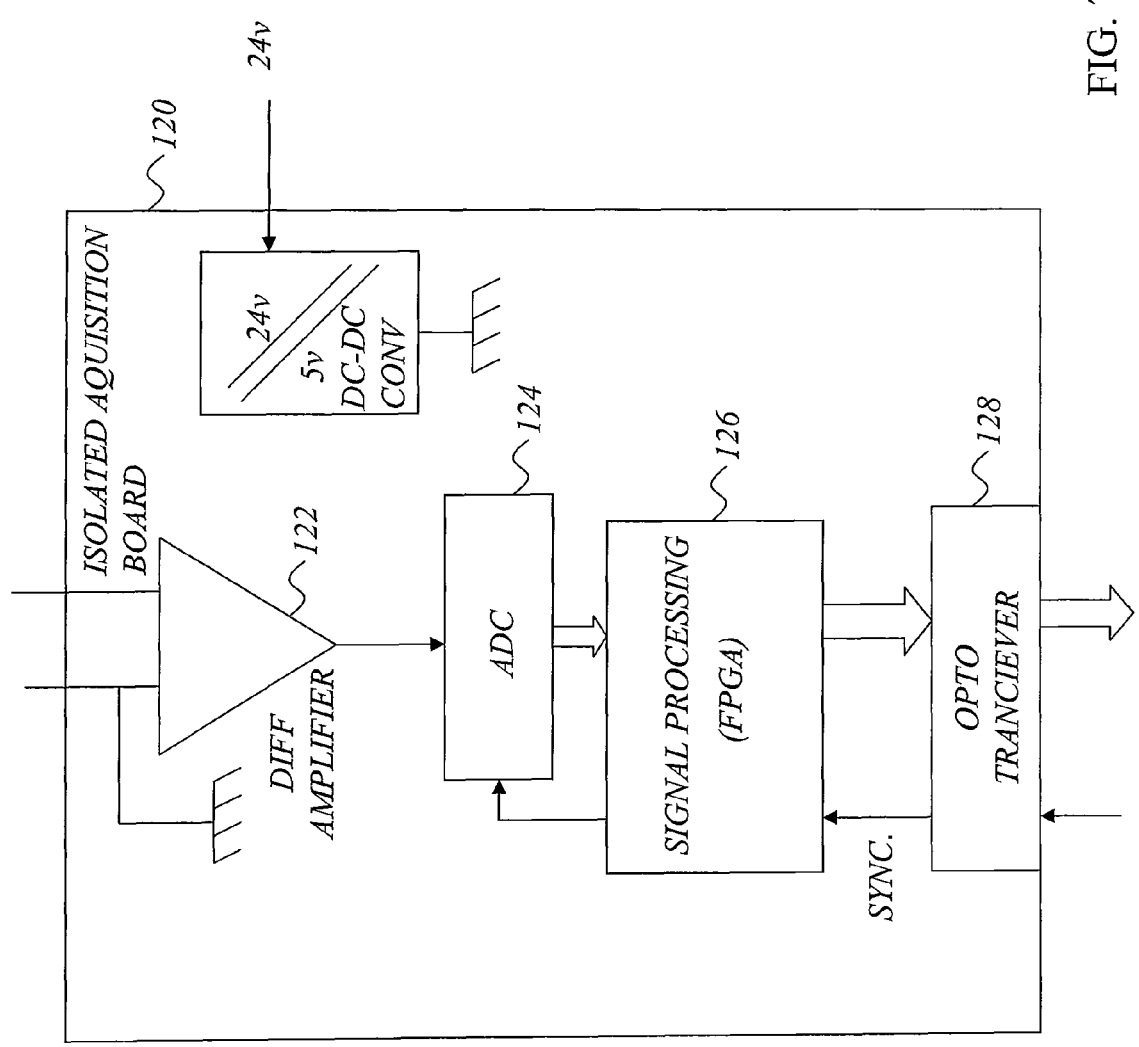
FIG. 7 is a schematic diagram illustrating a particular example of an isolated acquisition module or board for a capacitor charger system.

FIG. 7 is a schematic diagram illustrating a particular example of an isolated acquisition module or board for a capacitor charger system. As previously mentioned, the isolated acquisition module 120 may include a differential amplifier 122. The output from the amplifier 122 is preferably sampled with an ADC 124, and the digital value is going to a digital signal processing module 126. This module 126 is basically converting the sampled data to a serial protocol which is sent out by an opto transceiver 128, i.e. the optical input/output interface. The opto transceiver 128 is also receiving a synchronization signal coming from the digital control module 130. This signal is typically processed by the digital signal processing module 126 to generate sample control pulses for the ADC 124. For example, the digital signal processing module 126 may be implemented in a Field Programmable Gate Array (FPGA), or alternatively in an Application Specific Integrated Circuit (ASIC) or a Digital Signal Processor (DSP).

The embodiments described above are merely given as examples, and it should be understood that the present invention is not limited thereto. Further modifications, changes and improvements which retain the basic underlying principles disclosed and claimed herein are within the scope of the invention.

The invention claimed is:

1. A capacitor charger system comprising:
a capacitor charger module;
an isolated acquisition module for sampling an output voltage level of said capacitor charger module;
a digital control module, connected to said isolated acquisition module via a bidirectional link and connected to said capacitor charger module via a control signal interface, for generating control signal information and synchronization signal information based on data representative of sampled output voltage levels received via said bidirectional link from said isolated acquisition module, and for sending said control signal information to said capacitor charger module via said control signal interface and for sending said synchronization signal information to said isolated acquisition module via said bi-directional link,
wherein said capacitor charger module is controlled based on said control signal information from said digital control module; and
wherein said isolated acquisition module is configured for performing said sampling based on said synchronization signal information.

2. The capacitor charger system of claim 1, wherein said isolated acquisition module is configured for performing said sampling based on said synchronization signal information at a controlled timing relation to the output pulses of said capacitor charger module.

3. The capacitor charger system of claim 2, wherein said capacitor charger module is a Pulse Width Modulated (PWM) capacitor charger module, and said digital control module is configured for generating said control signal information in the form of a PWM control pattern including PWM control pulses, wherein said isolated acquisition module is configured for performing sampling of an output voltage level of said capacitor charger module in close relation before a next PWM control pulse so that distortions in the output voltage of said capacitor charger module from a previous output pulse have faded down to an acceptable level.

4. The capacitor charger system of claim 2, wherein the output pulse frequency of said capacitor charger module is higher than 10 KHz, and preferably in the order of 25 kHz or higher, and the sampling frequency is at least as high as said output pulse frequency.

5. The capacitor charger system of claim 4, wherein the sampling frequency is higher than 50 kHz, and preferably in the order of 1 MHz or higher.

6. The capacitor charger system of claim 1, wherein said isolated acquisition module is configured for performing sampling isolated from common ground.

7. The capacitor charger system of claim 1, wherein said bi-directional link is a digital optical link, and said isolated acquisition module and said digital control module each includes an optical input/output interface.

8. The capacitor charger system of claim 1, wherein said isolated acquisition module includes a signal acquisition circuit connected to an analog-to-digital converter (ADC)$_1$ which in turn is connected to a first digital signal processing module, wherein the sampling of said ADC is controlled based on said synchronization signal information.

9. The capacitor charger system of claim 8, wherein said first digital processing module is implemented in a Field Programmable Gate Array (FPGA)$_1$ an Application Specific Integrated Circuit (ASIC) or a Digital Signal Processor (DSP).

10. The capacitor charger system of claim 1, wherein said digital control module includes a second digital processing module configured for generating control data based on said sampled signal levels received from said isolated acquisition module and a predetermined reference signal level, wherein said digital control module is configured for generating said control signal information based on said control data.

11. The capacitor charger system of claim 10, wherein said capacitor charger module is a Pulse Width Modulated (PWM) capacitor charger module, and said digital control module further includes a driver circuit connected to said second digital processing module for generating said control signal information in the form of a PWM control pattern based on said control data.

12. The capacitor charger system of claim 10, wherein said second digital processing module is implemented in a Field Programmable Gate Array (FPGA)$_1$ an Application Specific Integrated Circuit (ASIC) or a Digital Signal Processor (DSP).

13. The capacitor charger system of claim 1, wherein the output pulses of said capacitor charger module have a voltage higher than 500 V but lower than 2500 V, and preferably between 900 and 1500 V.

14. A power modulator comprising a capacitor charger system of claim 1.

15. A digital control module for a capacitor charger system, wherein said capacitor charger system has a capacitor charger module and an isolated acquisition module for sampling an output voltage level of said capacitor charger module, wherein said digital control module is connected to said isolated acquisition module via a bi-directional link and connected to said capacitor charger module via a control signal interface, wherein said digital control module is configured for generating control signal information and synchronization signal information based on data representative of sampled output voltage levels of said capacitor charger module received via said bidirectional link from said isolated acquisition module, wherein said digital control module is configured for sending said control signal information to said capacitor charger module via said control signal interface to control the output pulses of the capacitor charger module, and for sending said synchronization signal information to said isolated acquisition module via said bi-directional link to control the sampling operation of said isolated acquisition module.

16. The digital control module of claim 15, wherein said digital control module is configured for generating said synchronization signal information such that said sampling by said isolated acquisition module is performed at a controlled timing relation to the output pulses of said capacitor charger module.

17. The digital control module of claim 16, wherein said digital control module is configured for generating said control signal information in the form of a Pulse Width Modulated (PWM) control pattern including PWM control pulses, and configured for generating said synchronization signal information such that sampling of an output voltage level of said capacitor charger module is performed in close relation before a next PWM control pulse so that distortions in the output voltage of said capacitor charger module from a previous output pulse have faded down to an acceptable level.

18. An isolated acquisition module for a capacitor charger system, wherein said capacitor charger system has a capacitor charger module and a digital control module, wherein said isolated acquisition module is connected to said digital control module via a bi-directional link, and wherein said isolated acquisition module is configured for sampling an output voltage level of said capacitor charger module at a controlled timing relation to the output pulses of said capacitor charger module based on synchronization signal information from said digital control module.

19. The isolated acquisition module of claim 18, wherein said capacitor charger module is a Pulse Width Modulated (PWM) capacitor charger module for operation under the control of PWM control pulses, wherein said isolated acquisition module is configured for performing sampling of an output voltage level of said capacitor charger module in close relation before a next PWM control pulse so that distortions in the output voltage of said capacitor charger module from a previous output pulse have faded down to an acceptable level.

* * * * *